(12) United States Patent
Liang et al.

(10) Patent No.: US 11,328,782 B2
(45) Date of Patent: *May 10, 2022

(54) MEMORY ARCHITECTURE FOR ACCESS OF MULTIPLE PORTIONS OF A BLOCK OF MEMORY CELLS

(71) Applicant: MICRON TECHNOLOGY, INC., Boise, ID (US)

(72) Inventors: Ke Liang, Shanghai (CN); Jun Xu, Shanghai (CN)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 17/247,266

(22) Filed: Dec. 7, 2020

(65) Prior Publication Data

US 2021/0090670 A1    Mar. 25, 2021

Related U.S. Application Data

(60) Continuation of application No. 16/433,193, filed on Jun. 6, 2019, now Pat. No. 10,872,676, which is a (Continued)

(51) Int. Cl.
*G11C 16/34*  (2006.01)
*G11C 16/04*  (2006.01)
(Continued)

(52) U.S. Cl.
CPC ........ *G11C 16/349* (2013.01); *G11C 16/0483* (2013.01); *G11C 16/10* (2013.01);
(Continued)

(58) Field of Classification Search
CPC ..... G11C 16/0483; G11C 16/26; G11C 16/14; G11C 16/10; G11C 16/3427
See application file for complete search history.

(56) References Cited

U.S. PATENT DOCUMENTS 7,804,718 B2   9/2010  Kim
8,300,463 B2  10/2012  Park et al.
(Continued)

OTHER PUBLICATIONS

International Search Report for Application No. PCT/CN2017/099234 dated Jun. 1, 2018 (5 pages).

*Primary Examiner* — Vanthu T Nguyen
(74) *Attorney, Agent, or Firm* — Dicke, Billig & Czaja, PLLC

(57) ABSTRACT

Memory might have a controller configured to program a first portion of memory cells of a string of series-connected memory cells closer to a particular end of the string than a second portion of memory cells of the string in an order from a different end of the string to the particular end, and program the second portion of memory cells in an order from the particular end to the different end. Memory might further have a controller configured to increment first and second read counts in response to performing a read operation on a memory cell of a block of memory cells, reset the first read count in response to performing an erase operation on a first portion of the block of memory cells, and reset the second read count in response to performing an erase operation on the second portion of the block of memory cells.

21 Claims, 6 Drawing Sheets

Related U.S. Application Data division of application No. 15/569,854, filed as application No. PCT/CN2017/099234 on Aug. 28, 2017, now Pat. No. 10,418,106.

(51) Int. Cl.
*G11C 16/10* (2006.01)
*G11C 16/26* (2006.01)
*G11C 16/14* (2006.01)

(52) U.S. Cl.
CPC .......... *G11C 16/26* (2013.01); *G11C 16/3427* (2013.01); *G11C 16/14* (2013.01)

(56) References Cited

U.S. PATENT DOCUMENTS

| | | |
|---|---|---|
| 8,593,873 B2 | 11/2013 | Cerafogli et al. |
| 8,954,650 B2 | 2/2015 | Belgal et al. |
| 8,976,583 B2 | 3/2015 | Kim |
| 9,355,724 B2 | 5/2016 | Oh et al. |
| 9,372,790 B2 | 6/2016 | Lee et al. |
| 9,424,935 B2 | 8/2016 | Shim |
| 9,552,171 B2 | 1/2017 | Huang et al. |
| 9,583,201 B1 | 2/2017 | Lee |
| 9,721,664 B2 | 8/2017 | Nam et al. |
| 9,728,262 B2 | 8/2017 | Baran et al. |
| 10,049,746 B2 | 8/2018 | Lee et al. |
| 10,354,737 B2 * | 7/2019 | Hu ........................ G11C 16/349 |
| 2009/0129152 A1 | 5/2009 | Roohparvar |
| 2016/0118132 A1 | 4/2016 | Prins et al. |
| 2017/0076805 A1 | 3/2017 | Goda et al. |
| 2018/0374551 A1 | 12/2018 | Hu |

* cited by examiner

MEMORY ARCHITECTURE FOR ACCESS OF MULTIPLE PORTIONS OF A BLOCK OF MEMORY CELLS

RELATED APPLICATIONS

This Application is a Continuation of U.S. patent application Ser. No. 16/433,193, titled "METHODS OF PERFORMING READ COUNT LEVELING FOR MULTIPLE PORTIONS OF A BLOCK OF MEMORY CELLS," filed Jun. 6, 2019, issued as U.S. Pat. No. 10,872,676 on Dec. 22, 2020, which is a Divisional of U.S. patent application Ser. No. 15/569,854, titled "METHODS OF PROGRAMMING DIFFERENT PORTIONS OF MEMORY CELLS OF A STRING OF SERIES-CONNECTED MEMORY CELLS," filed Oct. 27, 2017, issued as U.S. Pat. No. 10,418,106 on Sep. 17, 2019, which is a U.S. National Stage Application of International Application No. PCT/CN2017/099234 filed Aug. 28, 2017, which are commonly assigned and incorporated herein by reference. This Application is further related to U.S. patent application Ser. No. 16/433,212, titled "METHODS OF PROGRAMMING DIFFERENT PORTIONS OF MEMORY CELLS OF A STRING OF SERIES-CONNECTED MEMORY CELLS," filed Jun. 6, 2019, which is a Continuation of U.S. patent application Ser. No. 15/569,854.

TECHNICAL FIELD

The present disclosure relates generally to memory and, in particular, in one or more embodiments, the present disclosure relates to memory architecture and its operation.

BACKGROUND

Memory devices are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory has developed into a popular source of non-volatile memory for a wide range of electronic applications. Flash memory typically use a one-transistor memory cell that allows for high memory densities, high reliability, and low power consumption. Changes in threshold voltage (Vt) of the memory cells, through programming (which is often referred to as writing) of charge storage structures (e.g., floating gates or charge traps) or other physical phenomena (e.g., phase change or polarization), determine the data state (e.g., data value) of each memory cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory is a common type of flash memory device, so called for the logical form in which the basic memory cell configuration is arranged. Typically, the array of memory cells for NAND flash memory is arranged such that the control gate of each memory cell of a row of the array is connected together to form an access line, such as a word line. Columns of the array include strings (often termed NAND strings) of memory cells connected together in series between a pair of select gates, e.g., a source select transistor and a drain select transistor. Each source select transistor may be connected to a source, while each drain select transistor may be connected to a data line, such as column bit line. Variations using more than one select gate between a string of memory cells and the source, and/or between the string of memory cells and the data line, are known.

Memory cells are typically erased before they are programmed to a desired data state. For example, memory cells of a particular block of memory cells may first be erased and then selectively programmed. For a NAND array, a block of memory cells is typically erased by grounding all of the access lines (e.g., word lines) in the block and applying an erase voltage to the channel regions of the memory cells (e.g., through data lines and source connections) in order to remove charges that might be stored on data-storage structures (e.g., floating gates or charge traps) of the block of memory cells. Typical erase voltages might be on the order of 25V before completion of an erase operation.

A general goal in semiconductor memory seeks to increase the size of blocks of memory cells, e.g., increasing the number of memory cells in a column of memory cells and/or increasing the number of memory cells in a row of memory cells. However, increasing block size may lead to latency issues as memories perform housekeeping tasks on these larger blocks of memory cells. This, in turn, may limit the physical size of the blocks of memory in order to meet customer and/or industry standard requirements.

DETAILED DESCRIPTION

Figure 1:
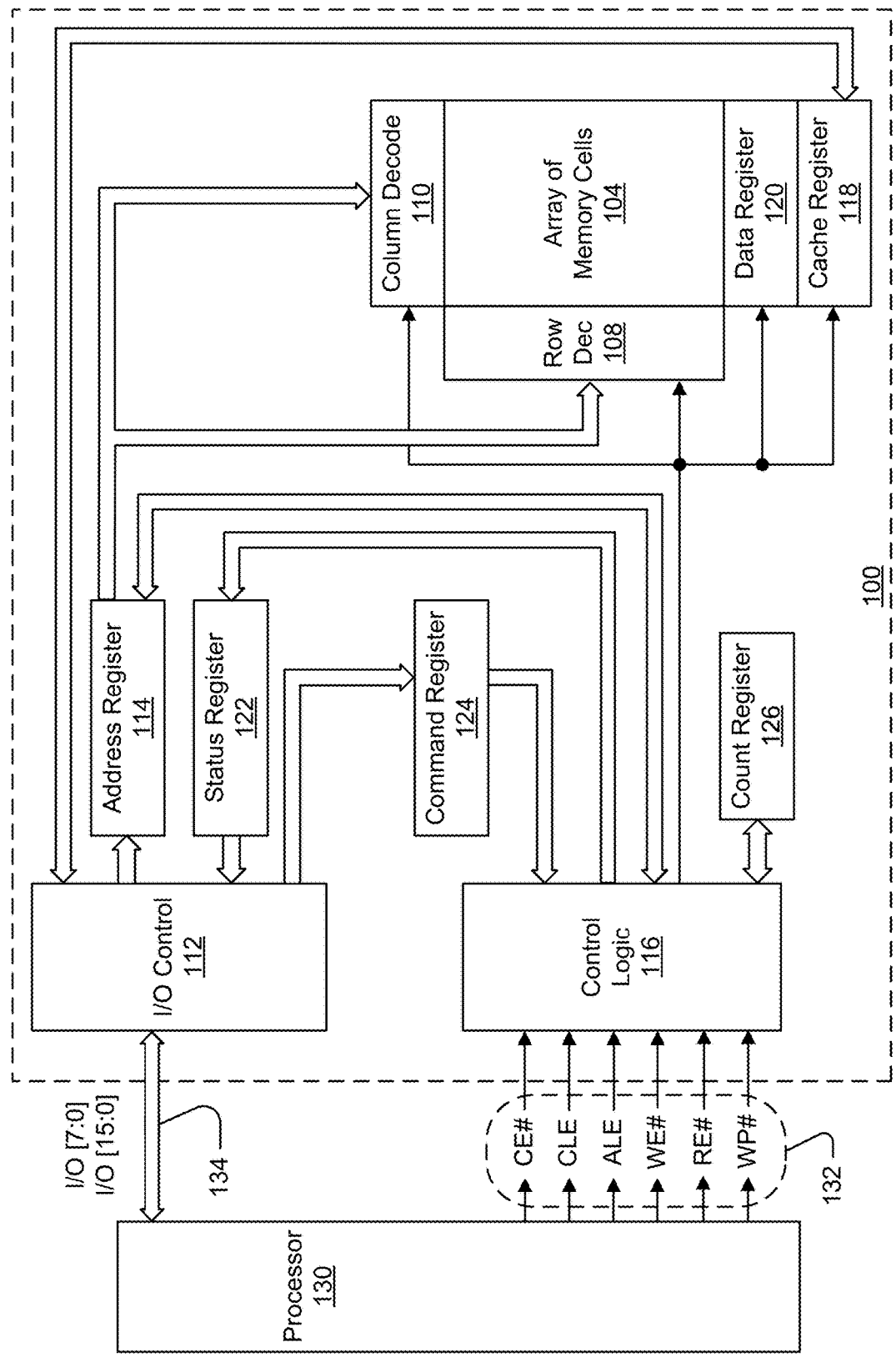
FIG. 1 is a simplified block diagram of a memory in communication with a processor as part of an electronic system, according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical and electrical changes may be made without departing from the scope of the present disclosure. The following detailed description is, therefore, not to be taken in a limiting sense.

The term "semiconductor" used herein can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps may have been utilized to form regions/junctions in the base semiconductor structure, and the term semiconductor can include the underlying layers containing such regions/junctions. The term conductive as used herein, as well as its various related forms, e.g., conduct, conductively, conducting, conduction, conductivity, etc., refers to electrically conductive unless otherwise apparent from the context. Similarly, the term connecting as used herein, as well as its various related forms, e.g., connect, connected, connection, etc., refers to electrically connecting unless otherwise apparent from the context.

FIG. 1 is a simplified block diagram of a first apparatus, in the form of a memory (e.g., memory device) 100, in communication with a second apparatus, in the form of a processor 130, as part of a third apparatus, in the form of an electronic system, according to an embodiment. Some examples of electronic systems include personal computers, personal digital assistants (PDAs), digital cameras, digital media players, digital recorders, games, appliances, vehicles, wireless devices, cellular telephones and the like. The processor 130, e.g., a controller external to the memory device 100, may be a memory controller or other external host device.

Memory device 100 includes an array of memory cells 104 logically arranged in rows and columns. Memory cells of a logical row are typically connected to the same access line (commonly referred to as a word line) while memory cells of a logical column are typically selectively connected to the same data line (commonly referred to as a bit line). A single access line may be associated with more than one logical row of memory cells and a single data line may be associated with more than one logical column. Memory cells (not shown in FIG. 1) of at least a portion of array of memory cells 104 are capable of being programmed to one of at least two data states.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands. A count register 126 may be in communication with the control logic 116 to store count data, such as data representative of respective numbers of read cycles for different portions of the array of memory cells 104. Although depicted as a separate storage register, count register 126 may represent a portion of the array of memory cells 104.

A controller (e.g., the control logic 116 internal to the memory device 100) controls access to the array of memory cells 104 in response to the commands and generates status information for the external processor 130, i.e., control logic 116 is configured to perform access operations (e.g., read operations, program operations and/or erase operations) in accordance with embodiments described herein. The control logic 116 is in communication with row decode circuitry 108 and column decode circuitry 110 to control the row decode circuitry 108 and column decode circuitry 110 in response to the addresses.

Control logic 116 is also in communication with a cache register 118. Cache register 118 latches data, either incoming or outgoing, as directed by control logic 116 to temporarily store data while the array of memory cells 104 is busy writing or reading, respectively, other data. During a program operation (e.g., write operation), data is passed from the cache register 118 to data register 120 for transfer to the array of memory cells 104; then new data is latched in the cache register 118 from the I/O control circuitry 112. During a read operation, data is passed from the cache register 118 to the I/O control circuitry 112 for output to the external processor 130; then new data is passed from the data register 120 to the cache register 118. A status register 122 is in communication with I/O control circuitry 112 and control logic 116 to latch the status information for output to the processor 130.

Memory device 100 receives control signals at control logic 116 from processor 130 over a control link 132. The control signals might include a chip enable CE #, a command latch enable CLE, an address latch enable ALE, a write enable WE #, a read enable RE #, and a write protect WP #. Additional or alternative control signals (not shown) may be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands are received over input/output (I/O) pins [7:0] of I/O bus 134 at I/O control circuitry 112 and are written into command register 124. The addresses are received over input/output (I/O) pins [7:0] of I/O bus 134 at I/O control circuitry 112 and are written into address register 114. The data are received over input/output (I/O) pins [7:0] for an 8-bit device or input/output (I/O) pins [15:0] for a 16-bit device at I/O control circuitry 112 and are written into cache register 118. The data are subsequently written into data register 120 for programming the array of memory cells 104. For another embodiment, cache register 118 may be omitted, and the data are written directly into data register 120. Data are also output over input/output (I/O) pins [7:0] for an 8-bit device or input/output (I/O) pins [15:0] for a 16-bit device.

It will be appreciated by those skilled in the art that additional circuitry and signals can be provided, and that the memory device 100 of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins may be used in the various embodiments.

Figure 2A:
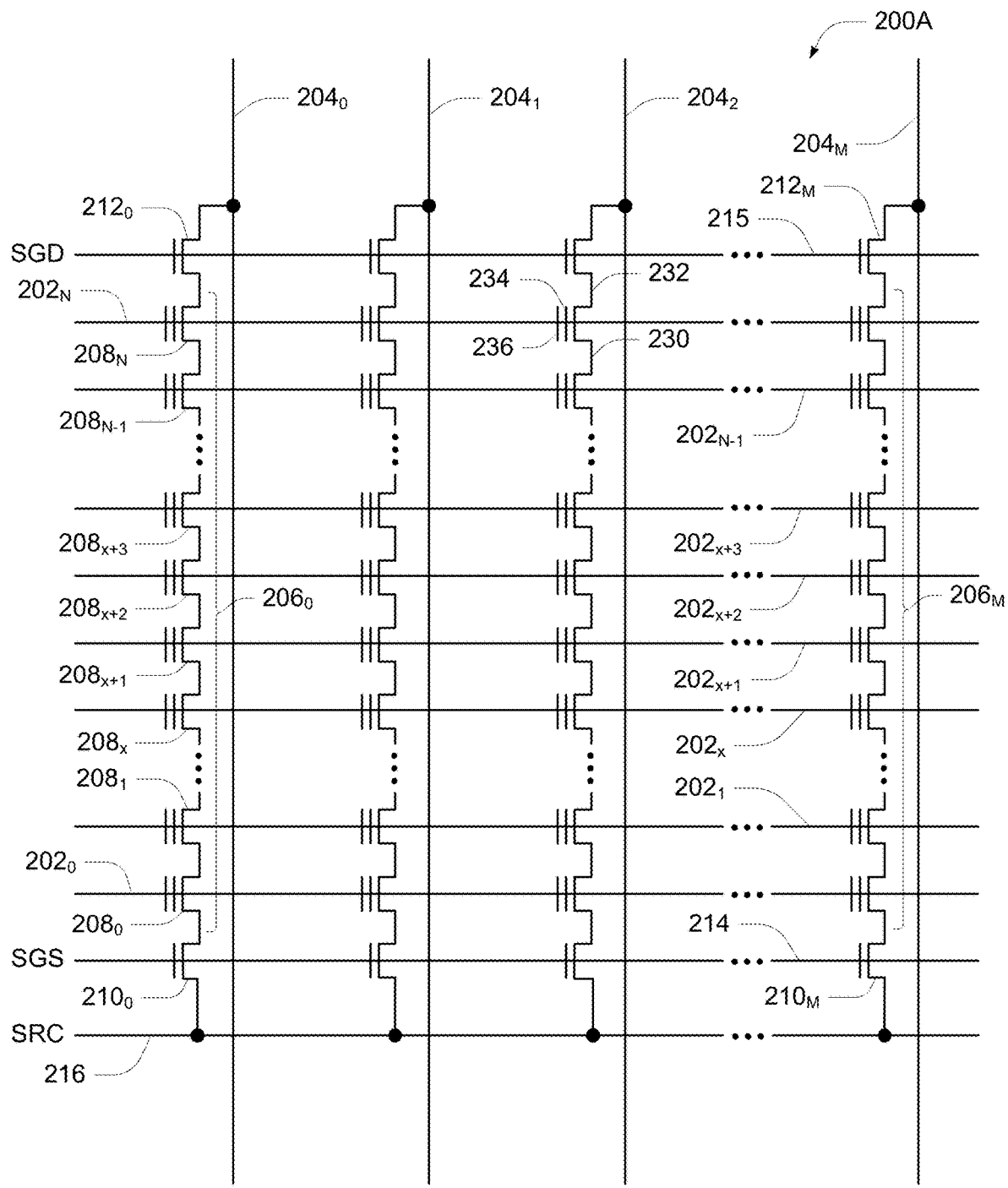
FIGS. 2A-2B are schematics of portions of an array of memory cells as could be used in a memory of the type described with reference to FIG. 1.

FIG. 2A is a schematic of a portion of an array of memory cells 200A as could be used in a memory of the type described with reference to FIG. 1, e.g., as a portion of array of memory cells 104. Memory array 200A includes access lines, such as word lines $202_0$ to $202_N$, and a data line, such as bit line 204. The word lines 202 may be connected to global access lines (e.g., global word lines), not shown in FIG. 2A, in a many-to-one relationship. For some embodiments, memory array 200A may be formed over a semiconductor that, for example, may be conductively doped to have a conductivity type, such as a p-type conductivity, e.g., to form a p-well, or an n-type conductivity, e.g., to form an n-well.

Memory array 200A might be arranged in rows (each corresponding to a word line 202) and columns (each corresponding to a bit line 204). Each column may include a string of series-connected memory cells (e.g., non-volatile memory cells), such as one of NAND strings $206_0$ to $206_M$. Each NAND string 206 might be connected (e.g., selectively connected) to a common source 216 and might include memory cells $208_0$ to $208_N$. The memory cells 208 may represent non-volatile memory cells for storage of data. The memory cells 208 of each NAND string 206 might be connected in series between a select gate 210 (e.g., a field-effect transistor), such as one of the select gates $210_0$ to $210_M$ (e.g., that may be source select transistors, commonly referred to as select gate source), and a select gate 212 (e.g., a field-effect transistor), such as one of the select gates $212_0$ to $212_M$ (e.g., that may be drain select transistors, commonly referred to as select gate drain). Select gates $210_0$ to $210_M$ might be commonly connected to a select line 214, such as a source select line, and select gates $212_0$ to $212_M$ might be commonly connected to a select line 215, such as a drain select line. Although depicted as traditional field-effect transistors, the select gates 210 and 212 may utilize a structure similar to (e.g., the same as) the memory cells 208. The select gates 210 and 212 might represent a plurality of select gates connected in series, with each select gate in series configured to receive a same or independent control signal.

A source of each select gate 210 might be connected to common source 216. The drain of each select gate 210 might be connected to a memory cell $208_0$ of the corresponding NAND string 206. For example, the drain of select gate $210_0$ might be connected to memory cell $208_0$ of the corresponding NAND string $206_0$. Therefore, each select gate 210 might be configured to selectively connect a corresponding NAND string 206 to common source 216. A control gate of each select gate 210 might be connected to select line 214.

The drain of each select gate 212 might be connected to the bit line 204 for the corresponding NAND string 206. For example, the drain of select gate $212_0$ might be connected to the bit line $204_0$ for the corresponding NAND string $206_0$. The source of each select gate 212 might be connected to a memory cell $208_N$ of the corresponding NAND string 206. For example, the source of select gate $212_0$ might be connected to memory cell $208_N$ of the corresponding NAND string $206_0$. Therefore, each select gate 212 might be configured to selectively connect a corresponding NAND string 206 to the common bit line 204. A control gate of each select gate 212 might be connected to select line 215.

The memory array in FIG. 2A might be a three-dimensional memory array, e.g., where NAND strings 206 may extend substantially perpendicular to a plane containing the common source 216 and to a plane containing a plurality of bit lines 204 that may be substantially parallel to the plane containing the common source 216.

Typical construction of memory cells 208 includes a data-storage structure 234 (e.g., a floating gate, charge trap, etc.) that can determine a data state of the memory cell (e.g., through changes in threshold voltage), and a control gate 236, as shown in FIG. 2A. The data-storage structure 234 may include both conductive and dielectric structures while the control gate 236 is generally formed of one or more conductive materials. In some cases, memory cells 208 may further have a defined source/drain (e.g., source) 230 and a defined source/drain (e.g., drain) 232. Memory cells 208 have their control gates 236 connected to (and in some cases form) a word line 202.

A column of the memory cells 208 may be a NAND string 206 or a plurality of NAND strings 206 selectively connected to a given bit line 204. A row of the memory cells 208 may be memory cells 208 commonly connected to a given word line 202. A row of memory cells 208 can, but need not, include all memory cells 208 commonly connected to a given word line 202. Rows of memory cells 208 may often be divided into one or more groups of physical pages of memory cells 208, and physical pages of memory cells 208 often include every other memory cell 208 commonly connected to a given word line 202. For example, memory cells 208 commonly connected to word line $202_N$ and selectively connected to even bit lines 204 (e.g., bit lines $204_0$, $204_2$, $204_4$, etc.) may be one physical page of memory cells 208 (e.g., even memory cells) while memory cells 208 commonly connected to word line $202_N$ and selectively connected to odd bit lines 204 (e.g., bit lines $204_1$, $204_3$, $204_5$, etc.) may be another physical page of memory cells 208 (e.g., odd memory cells). Although bit lines $204_3$-$204_5$ are not explicitly depicted in FIG. 2A, it is apparent from the figure that the bit lines 204 of the array of memory cells 200A may be numbered consecutively from bit line $204_0$ to bit line $204_M$. Other groupings of memory cells 208 commonly connected to a given word line 202 may also define a physical page of memory cells 208. For certain memory devices, all memory cells commonly connected to a given word line might be deemed a physical page of memory cells. The portion of a physical page of memory cells (which, in some embodiments, could still be the entire row) that is read during a single read operation or programmed during a single programming operation (e.g., an upper or lower page of memory cells) might be deemed a logical page of memory cells. A block of memory cells may include those memory cells that are configured to be erased together, such as all memory cells connected to word lines $202_0$-$202_N$ (e.g., all NAND strings 206 sharing common word lines 202). Unless expressly distinguished, a reference to a page of memory cells herein refers to the memory cells of a logical page of memory cells.

Figure 2B:
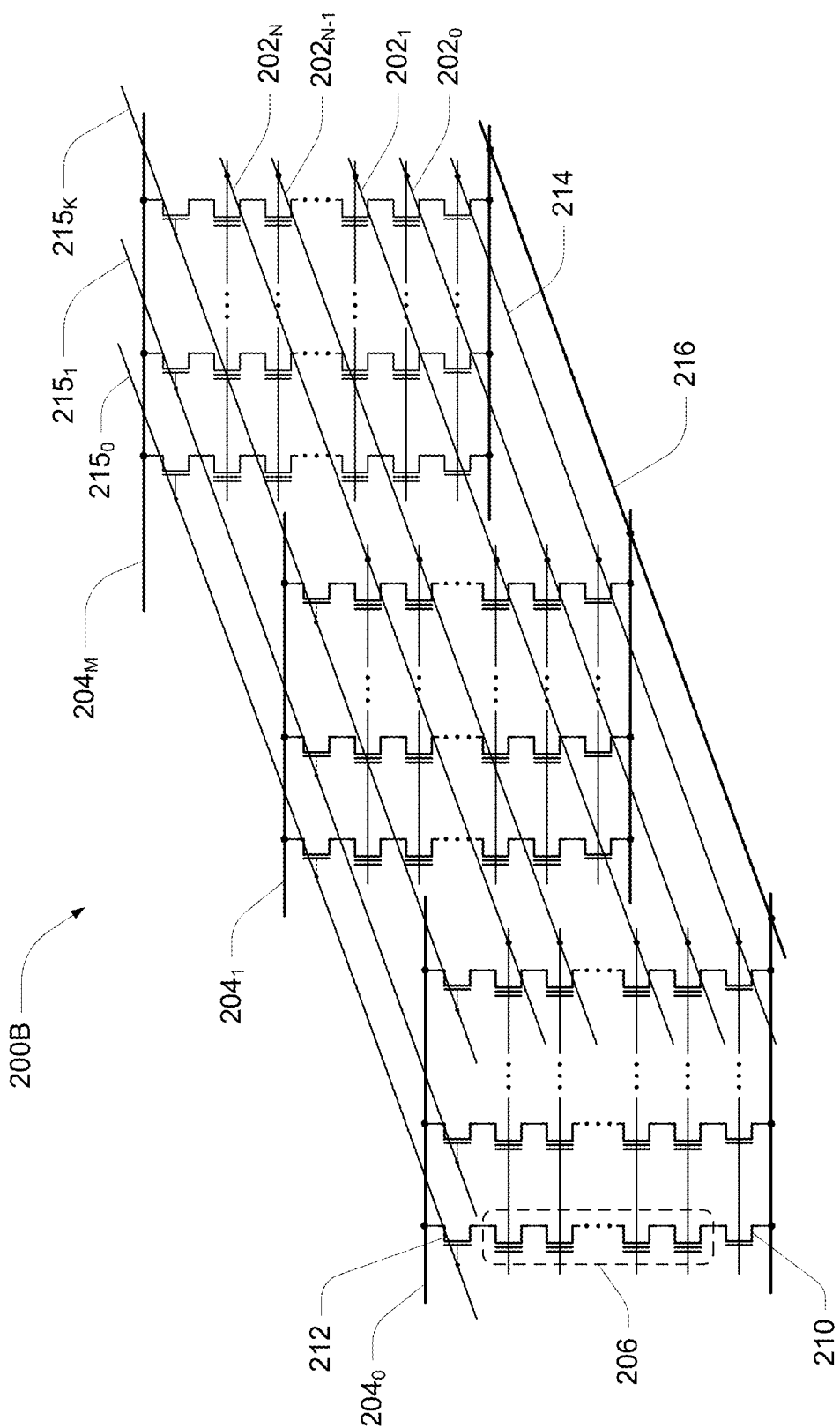

FIG. 2B is another schematic of a portion of an array of memory cells 200B as could be used in a memory of the type described with reference to FIG. 1, e.g., as a portion of array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B may incorporate vertical structures which may include semiconductor pillars where a portion of a pillar may act as a channel region of the memory cells of NAND strings 206. The NAND strings 206 may be each selectively connected to a bit line $204_0$-$204_M$ by a select transistor 212 (e.g., that may be drain select transistors, commonly referred to as select gate drain) and to a common source 216 by a select transistor 210 (e.g., that may be source select transistors, commonly referred to as select gate source). Multiple NAND strings 206 might be selectively connected to the same bit line 204. Subsets of NAND strings 206 can be connected to their respective bit lines 204 by biasing the select lines $215_0$-$215_K$ to selectively activate particular select transistors 212 each between a NAND string 206 and a bit line 204. The select transistors 210 can be activated by biasing the select line 214. Each word line 202 may be connected to multiple rows of memory cells of the memory array 200B. Rows of memory cells that are commonly connected to each other by a particular word line 202 may collectively be referred to as tiers.

Figure 3:
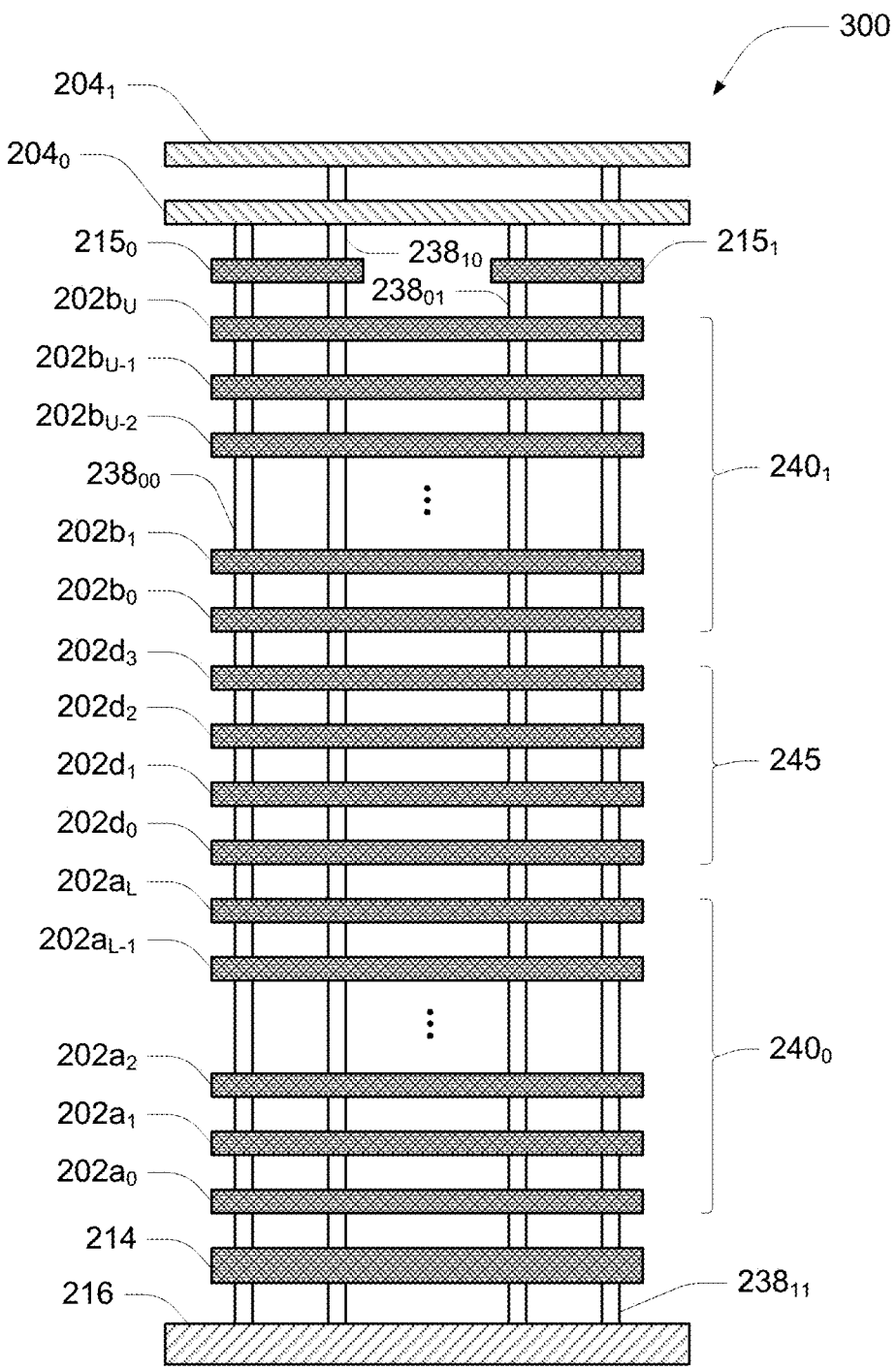
FIG. 3 is a conceptual depiction of a portion of a block of memory cells as could be used in a memory of the type described with reference to FIG. 1.

FIG. 3 is a conceptual depiction of a portion of a block (e.g., physical block) of memory cells 300 as could be used in a memory of the type described with reference to FIG. 1. Data Lines $204_0$ and $204_1$ of FIG. 3 might correspond to data lines $204_0$ and $204_1$ of FIG. 2B. Channel regions $238_{00}$ and $238_{01}$ might represent the channel regions of different strings of series-connected memory cells (e.g., NAND strings 206 of FIGS. 2A-2B) selectively connected to the data line $204_0$ in response to select lines $215_0$ and $215_1$, respectively. Similarly, channel regions $238_{10}$ and $238_{11}$ might represent the channel regions of different strings of series-connected memory cells (e.g., NAND strings 206 of FIGS. 2A-2B) selectively connected to the data line $204_1$ in response to select lines $215_0$ and $215_1$, respectively. The access lines $202_0$-$202_N$ depicted in FIG. 2A might be represented in FIG. 3 by the access lines $202a_0$-$202a_L$, $202d_0$-$202d_3$ and $202b_0$-$202b_U$, where N might be equal to L+U+6 in this example. A memory cell (not depicted in FIG. 3) may be formed at each intersection of an access line 202 and a channel region 238, and the memory cells corresponding to a signal channel regions may collectively form a series-string of memory cells (e.g., a NAND string of FIGS. 2A-2B).

Access lines $202d_0$-$202d_3$ may represent separator (e.g., dummy) access lines. While four dummy access lines 202d are depicted, other numbers might be used. In addition, these dummy access lines 202d may correspond to dummy memory cells, e.g., memory cells not intended to store user data. The dummy memory cells are typically not accessible to a user of the memory, and are typically incorporated into the string of series-connected memory cells for operational advantages. For example, as the number of access lines 202 between a source 216 and a data line 204 becomes larger, e.g., in response to increasing demands for memory capacity, physical limitations of technology may warrant forming the structure channel regions 238 in two parts as the aspect ratio of the hole becomes too large to form the entire structure reliably. As an example, the structure of the block of memory cells 300 might be formed to include up to access line 202di before a first portion of a channel region 238 is formed, and then a subsequent portion of the block of memory cells 300 might be formed to include up to the select lines 215 before a remaining portion of the channel region 238 is formed. To improve the conductivity between the two portions of the channel region 238, a conductive region might be formed between them. However, this may lead to different operating characteristics of the memory cells formed near this conductive region, such as is common for memory cells nearest the source 216 and those nearest a data line 204. By operating these memory cells as dummy memory cells, such differences in operating characteristics might generally be mitigated.

Such dummy access lines 202d may collectively form a separator portion 245 between one portion (e.g., deck) $240_1$ of a block of memory cells 300 (or one portion $240_1$ of each string of series-connected memory cells) and another portion (e.g., deck) $240_0$ of the block of memory cells 300 (or another portion $240_0$ of each string of series-connected memory cells). The portion $240_1$ is closer to one end of the strings of series-connected memory cells, e.g., closer to the select lines 215 and data lines 204, and the portion $240_0$ is closer to an opposite end of the strings of series-connected memory cells, e.g., closer to the select lines 214 and source 216. Each portion 240 might be considered a logical block of memory cells. The structure depicted and described with reference to FIG. 3 will be used to describe various embodiments herein.

As the access lines of the separator portion 245 may not be operated to stored user data, the might be used to shield one portion 240 of the block of memory cells 300 from operations on the other portion 240 of the block of memory cells 300. For example, an erase operation might be performed on memory cells of the portion $240_0$ without erasing memory cells of the portion $240_1$. This might be accomplished by applying an erase voltage (e.g., 20V) to the channel regions 238, such as through the data lines 204 and the source 216 while applying an erase select voltage (e.g., 1V) to access lines 202 corresponding to the memory cells intended for erasure, and while applying an erase inhibit voltage (e.g., 20V) to access lines 202 corresponding to the memory cells for which erasure is not desired. For example, to erase the portion $240_0$, the erase voltage might be applied to the channel regions 238 of the block of memory cells while applying the erase select voltage to the access lines 202a of the portion $240_0$, and while applying the erase inhibit voltage to the access lines 202b of the portion $240_1$. The access lines 202d might receive an intermediate voltage (e.g., 10V) during this time to mitigate stress between the access lines 202a and 202b. Additional detail of performing an erase operation on this type of structure might be found with reference to U.S. Patent Application Publication No. 2017/0076805 A1 issued to Goda et al.

Programming of a block of memory cells that can be erased in portions may present certain disadvantages. For example, it is common to program a block of memory cells from one end (e.g., from an access line 202 closest to the source 216) to the other end (e.g., to an access line 202 closest to the data line 204). However, in this scenario, if the memory cells of the portion $240_1$ are already programmed, the memory cells of the portion $240_0$ may experience unacceptable levels of program disturb in one or more lower data states (e.g., a lowest or initial data state). Various embodiments seek to mitigate this issue.

Figure 4A:
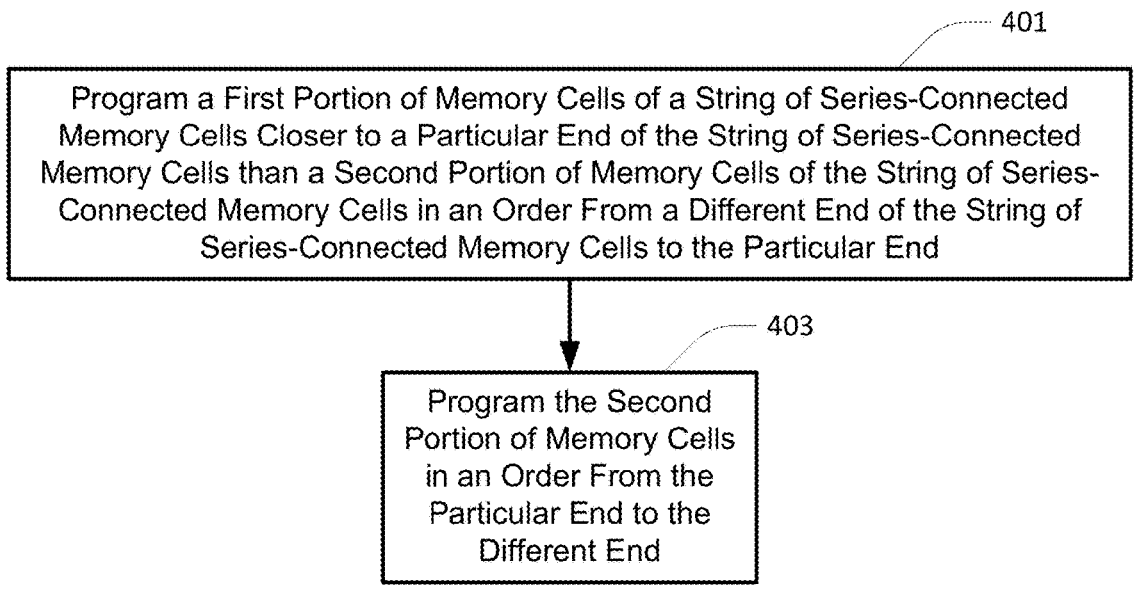
FIGS. 4A-4B are flowcharts of methods of operating a memory in accordance with embodiments.
Figure 4B:
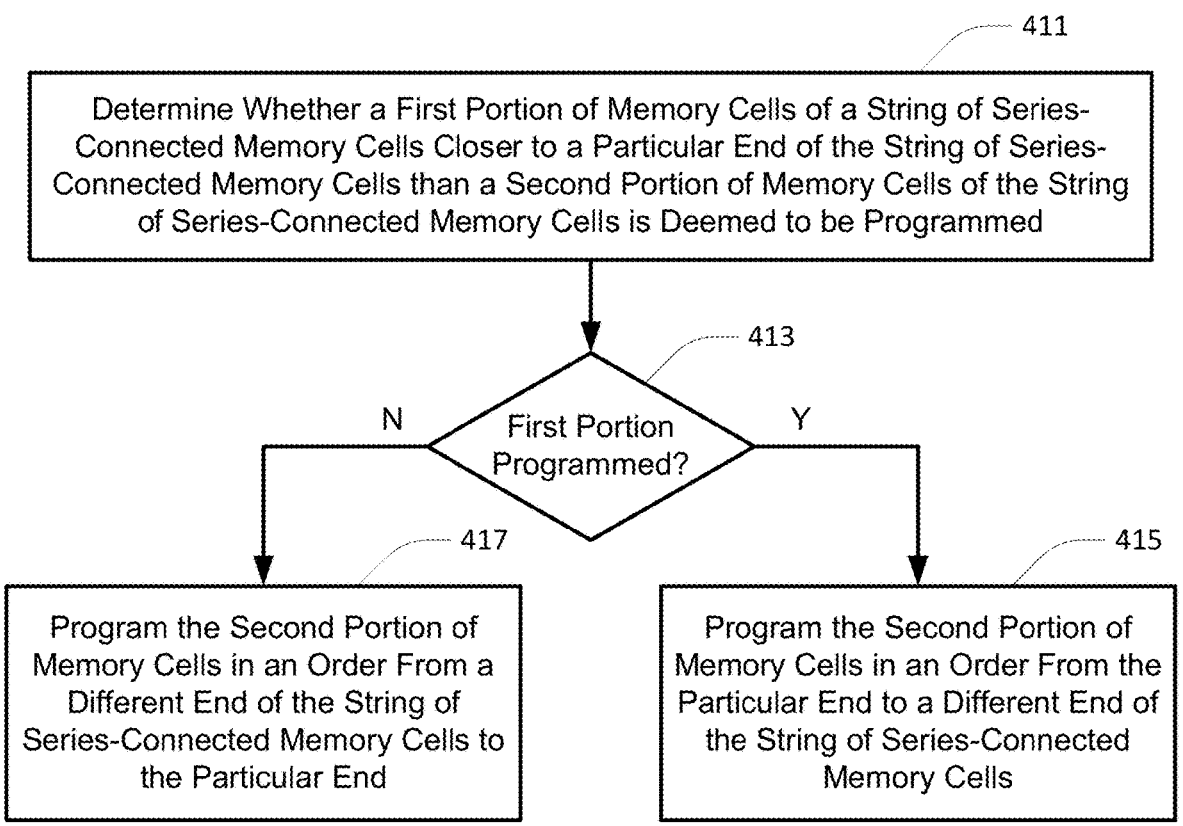

FIGS. 4A-4B are flowcharts of methods of operating a memory in accordance with embodiments. In FIG. 4A, at 401, a first portion (e.g., portion $240_0$ or $240_1$) of memory cells of a string of series-connected memory cells closer to a particular end of the string of series-connected memory cells (e.g., the end nearest the source 216 or the end nearest the data line 204, respectively) than a second portion (e.g., portion $240_1$ or $240_0$, respectively) of memory cells is programmed in an order from a different (e.g., opposite) end of the string of series-connected memory cells (e.g., the end nearest the data line 204 or the end nearest the source 216, respectively) to the particular end. For example, if the first portion of memory cells corresponds to those memory cells of the portion $240_0$, programming of the memory cells of the portion $240_0$ might begin with the memory cells coupled to the access line $202a_L$ and proceed in order to the memory cells coupled to the access line $202a_0$, while programming of the memory cells of the portion $240_1$ might begin with the memory cells coupled to the access line $202b_0$ and proceed in order to the memory cells coupled to the access line $202b_U$. Note that the memory cells of the portion $240_0$ might be programmed prior to programming the memory cells of the portion $240_1$, and vice versa. Programming of a portion of memory cells may further include programming memory cells corresponding to one or more of the dummy access lines, e.g., the dummy access lines closest to that portion of memory cells.

For some embodiments, it may be desirable to make the order of programming one portion of memory cells dependent on whether the other portion of memory cells has previously been programmed. FIG. 4B is a flowchart of such a method. In FIG. 4B, at 411, it is determined whether a first portion (e.g., portion $240_0$ or $240_1$) of memory cells of a string of series-connected memory cells closer to a particular end of the string of series-connected memory cells (e.g., the end nearest the source 216 or the end nearest the data line 204, respectively) than a second portion (e.g., portion $240_1$ or $240_0$, respectively) of memory cells of the string of series-connected memory cells is deemed to be programmed. Determination that the first portion of memory cells of the string of series-connected memory cells is deemed programmed might include determining whether the first portion of memory cells of the string of series-connected memory cells has been subjected to programming voltages after a most recent erase operation, e.g., in response to a programming operation. For example, where a portion $240_1$ of a block of memory cells 300 is the subject of a programming operation, each string of series-connected memory cells of the portion $240_1$ might be deemed to have been programmed even if each memory cell of a particular string of series-connected memory cells of the portion $240_1$ remains in its initial (e.g., erased) data state. Such determinations might include reading a flag having a value indicating that the portion 240 has experienced a programming operation. As an example, the flag might be stored in a reserved portion of the block of memory cells. The reserved portion of the block of memory cells might include memory cells of the portion $240_0$ or the portion $240_1$.

If the first portion of memory cells is deemed to be programmed at 413, the second portion of memory cells is programmed at 415 in an order from the particular end to a different (e.g., opposite) end of the string of series-connected memory cells. Alternatively, if the first portion of memory cells is not deemed to be programmed at 413, the second portion of memory cells is programmed at 417 in an order from a different (e.g., opposite) end of the string of series-connected memory cells to the particular end.

It is noted that while programming one portion of a block of memory cells, the other portion may experience Vpass disturb. As is typical in the prior art, a programming operation may include a first portion used to precharge or seed the channel regions of memory cells of a block of memory cells to a precharge voltage level, a second portion used to boost the voltage level of the channel regions of strings of series-connected memory cells of the block of memory cells not intended for programming (e.g., to be inhibited) to a voltage level sufficient to inhibit programming of any memory cell of those strings of series-connected memory cells receiving a programming voltage, and a third portion used for programming one or more selected memory cells of other strings of memory cells of the block of memory cells. The first portion typically involves applying a voltage (e.g., Vcc or other supply voltage) to at least those data lines to be inhibited from programming (e.g., unselected data lines) while those data lines are connected to their respective channel regions (e.g., unselected channel regions) through the activation of the drain select gates and all memory cells associated with those channel regions. The second portion typically involves electrically floating those unselected channel regions, and then increasing the access line voltages to a pass voltage (e.g., Vpass) in order to boost the voltage level of the unselected channel regions. The voltage level of the pass voltage might be selected to reach a boosted voltage level of the unselected channel regions to a level sufficient to inhibit programming of any corresponding memory cell receiving a programming voltage in the third portion of the programming operation. For situations where a portion of the block of memory cells is already programmed, voltage levels necessary to activate those memory cells during the precharge portion would be higher.

Figure 5:
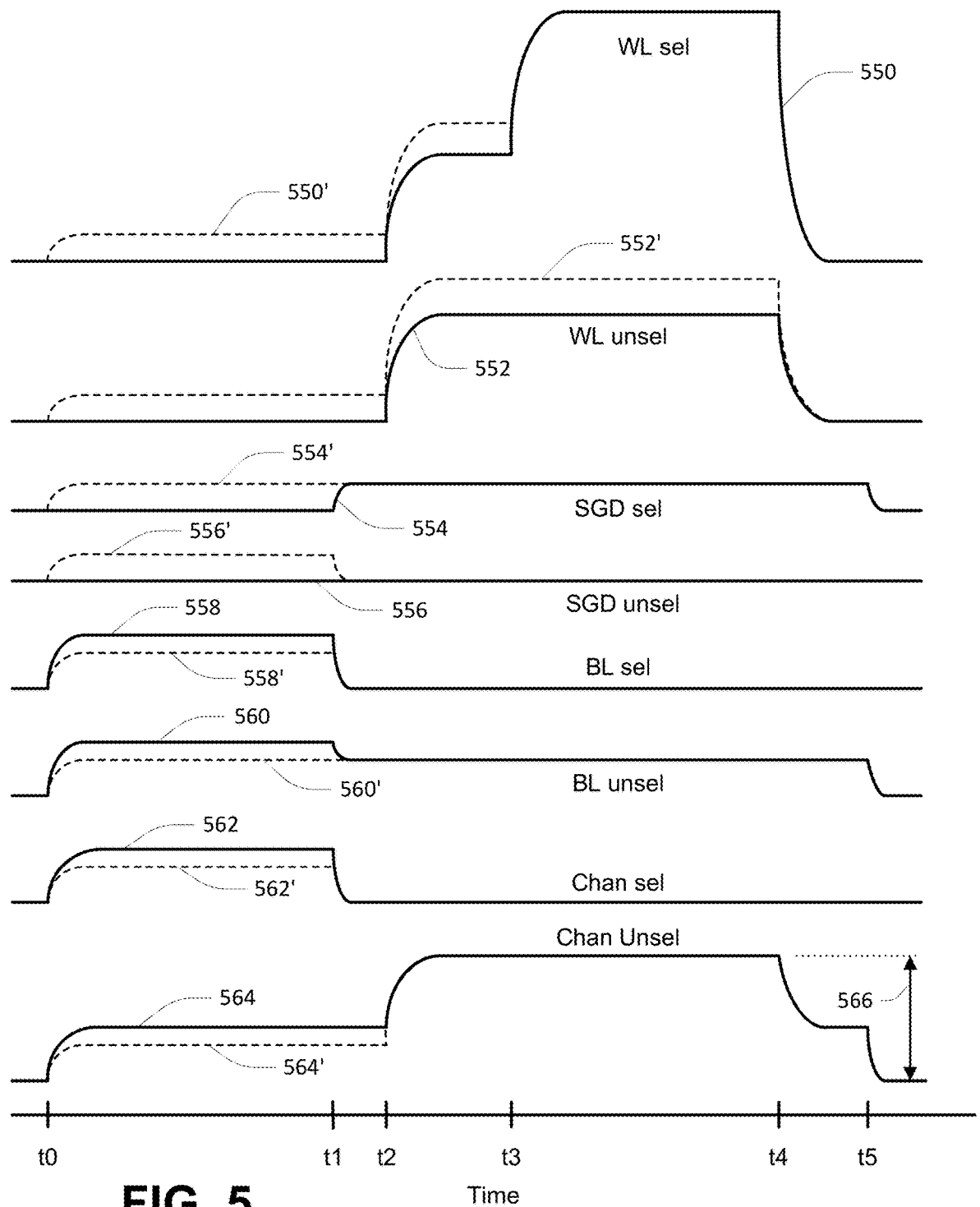
FIG. 5 is a timing diagram generally depicting voltage levels of various nodes of a block of memory cells such as depicted in FIG. 3 at various stages of a programming operation in accordance with embodiments.

Reductions in the voltage level of the pass voltage may facilitate a reduction in Vpass disturb. Various embodiments may alter the precharge portion of a programming operation and use GIDL (gate-induced drain leakage) as a mechanism to seed the unselected channel regions. GIDL would not need to rely on the activation of select gates or memory cells in order to seed the channel region, thus also avoiding the need to use higher access line voltages during the precharge portion of the programming operation. FIG. 5 is a timing diagram generally depicting voltage levels of various nodes of a block of memory cells such as depicted in FIG. 3 at various stages of a programming operation in accordance with such embodiments. While FIG. 5 will be described in relation to the type of programming operation performed in response to a write command to store user data to the block of memory cells, the programming operation may further include preprogramming as is often used as part of an erase operation to mitigate risks of over erasing memory cells already in the erased data state.

Consider the block of memory cells 300 of FIG. 3, wherein the memory cell formed at the intersection of the access line $202b_0$ and the channel region $238_{00}$ is selected for programming, but remaining memory cells are to be inhibited from programming. In this example, the access line $202b_0$ would be a selected access line, e.g., an access line selected for programming, while access lines $202a_0$-$202a_L$, $202d_0$-$202d_3$, and $202b_1$-$202b_U$ would be unselected access lines, e.g., access lines unselected for programming. Similarly, the channel region $238_{00}$ would be a selected channel region, while the channel regions $238_{01}$, $238_{10}$ and $238_{11}$ would be unselected channel regions. Data line $204_0$ would be a selected data line, while data line $204_1$ would be an unselected data line. Select line $215_0$ would be a selected select line, while select line $215_1$ would be an unselected select line.

In FIG. 5, waveform 550 (WL sel) represents the waveform of a voltage level of the selected access line during a programming operation in accordance with an embodiment, while the waveform 550' represents the waveform of a voltage level of the selected access line during a programming operation of the prior art. The waveform 552 (WL unsel) represents the waveform of a voltage level of the unselected access lines during the programming operation in accordance with an embodiment, while the waveform 552' represents the waveform of a voltage level of an unselected access line during the programming operation of the prior art.

The waveform 554 (SGD sel) represents the waveform of a voltage level of a selected select line (e.g., drain select line) during the programming operation in accordance with an embodiment, while the waveform 554' represents the waveform of a voltage level of a selected select line during the programming operation of the prior art. The waveform 556 (SGD unsel) represents the waveform of a voltage level of an unselected select line (e.g., drain select line) during the programming operation in accordance with an embodiment, while the waveform 556' represents the waveform of a voltage level of an unselected select line during the programming operation of the prior art.

The waveform 558 (BL sel) represents the waveform of a voltage level of a selected data line (e.g., bit line) during the programming operation in accordance with an embodiment, while the waveform 558' represents the waveform of a voltage level of a selected data line during the programming operation of the prior art. The waveform 560 (BL unsel) represents the waveform of a voltage level of an unselected data line (e.g., bit line) during the programming operation in accordance with an embodiment, while the waveform 560' represents the waveform of a voltage level of an unselected data line during the programming operation of the prior art.

The waveform 562 (Chan sel) represents the waveform of a voltage level of a selected channel region during the programming operation in accordance with an embodiment, while the waveform 562' represents the waveform of a voltage level of a selected channel region during the programming operation of the prior art. The waveform 564 (Chan unsel) represents the waveform of a voltage level of an unselected channel region during the programming operation in accordance with an embodiment, while the waveform 564' represents the waveform of a voltage level of an unselected channel region during the programming operation of the prior art.

In the prior art programming operation, at time t0, the voltage level 550' of the selected access line, the voltage level 552' of the unselected access line, the voltage level 554' of the selected select line and the voltage level 556' of the unselected select line might be raised (e.g., biased) to some voltage level sufficient to activate their corresponding memory cells and select gates (e.g., drain select gates) while the voltage level 558' of the selected data and the voltage level 560' of the unselected data line might be raised (e.g., biased) to a voltage level such as Vcc. As a result, the voltage level 562' of the selected channel region and the voltage level 564' of the unselected channel region might be brought up to the voltage level data lines, such as Vcc. At time t1, the voltage level 558' of the selected data line might be lowered (e.g., discharged) to a reference voltage level, such as Vss (e.g., ground or 0V), and the voltage level 556' of the unselected select line might be lowered (e.g., discharged) to the reference voltage level. As a result, the voltage level 562' of the selected channel region may lower to the reference voltage due to its connection to the selected data line, while the unselected channel region may be left electrically floating as the select gate to the unselected data line is deactivated. The time period from time t0 to time t2 might correspond to the precharge portion of the programming operation.

At time t2, the voltage level 550' of the selected access line and the voltage level 552' of the unselected access line might be raised (e.g., biased) to some voltage level sufficient to boost the voltage level of the unselected channel region to a particular voltage level 566 sufficient to inhibit programming of a memory cell corresponding to the unselected channel region receiving a programming voltage on its corresponding selected access line. The time period from time t2 to time t3 might correspond to the boost portion of the programming operation.

At time t3, the voltage level 550' of the selected access line might be raised (e.g., biased) to a programming voltage, e.g., some voltage level sufficient to cause accumulation of charge on a data-storage structure of a memory cell corresponding to the selected access line and a selected channel region. At time t4, the voltage level 550' of the selected access line and the voltage level 552' of the unselected access line might be lowered (e.g., discharged) to the reference voltage, while at time t5, remaining voltage levels might be lowered (e.g., discharged) to the reference voltage. The time period from time t3 to time t4 might correspond to the programming portion of the programming operation.

In contrast to the prior art programming operation, at time t0 for an embodiment, the voltage level 550 of the selected access line, the voltage level 552 of the unselected access line, the voltage level 554 of the selected select line and the voltage level 556 of the unselected select line might maintained at the reference voltage while the voltage level 558 of the selected data and the voltage level 560 of the unselected data line might be raised (e.g., biased) to a voltage level sufficient to induce GIDL, e.g., 3V. As a result, the voltage level 562 of the selected channel region and the voltage level 564 of the unselected channel region might be brought up to the voltage level data lines, e.g., 3V. At time t1, the voltage level 558 of the selected data line might be lowered (e.g., discharged) to the reference voltage, and the voltage level 554 of the selected select line might be raised (e.g., biased) to some voltage level sufficient to inhibit GIDL, e.g., 2V. As a result, the voltage level 562 of the selected channel region may lower to the reference voltage due to its connection to the selected data line, while the unselected channel region may be left electrically floating as the select gate to the unselected data line is deactivated. The time period from time t0 to time t2 might correspond to the precharge portion of the programming operation.

At time t2 for the embodiment, the voltage level 550 of the selected access line and the voltage level 552 of the unselected access line might be raised (e.g., biased) to some voltage level sufficient to boost the voltage level of the unselected channel region to the particular voltage level 566 sufficient to inhibit programming of a memory cell corresponding to the unselected channel region receiving a programming voltage on its corresponding selected access line. Note that the voltage level 550 of the selected access line and the voltage level 552 of the unselected access line may be less than their corresponding voltage levels of the prior art programming operation. This is due in part to seeding the channel regions to a higher level, but because the access lines started at the reference voltage prior to boost, the boost may also be more efficient. The time period from time t2 to time t3 might correspond to the boost portion of the programming operation.

At time t3 for the embodiment, the voltage level 550 of the selected access line might be raised (e.g., biased) to a programming voltage, e.g., some voltage level sufficient to cause accumulation of charge on a data-storage structure of a memory cell corresponding to the selected access line and a selected channel region. At time t4, the voltage level 550 of the selected access line and the voltage level 552 of the unselected access line might be lowered (e.g., discharged) to the reference voltage, while at time t5, remaining voltage levels might be lowered (e.g., discharged) to the reference voltage. The time period from time t3 to time t4 might correspond to the programming portion of the programming operation.

For some embodiments, apparatus may perform housekeeping operations. One such housekeeping operation is read count leveling. Read count leveling takes into account basic physics of the apparatus. When a page of memory cells of a block of memory cells of the type depicted in FIG. 3 is accessed via a read command, that read command affects (e.g., disturbs) other pages of memory cells in the same block of memory cells. For example, in a block of memory cells with 256 logical pages of memory cells, accessing page 0 via a read command disturbs pages 1 through 255. No matter what page is accessed, the other pages in the block may be subject to the same disturb.

NAND providers typically provide a specification on a page level read capability. This number is generally not expressed as a limit for total page reads of a block of memory cells, however. Instead, it is typical to express the specification as a total number of supported reads for a block of memory cells divided by the number of pages contained in that block of memory cells. For example, in a block of memory cells having 256 logical pages of memory cells, and a page level read capability of 100,000, each page of memory cells of that block of memory cells might be read 100,000 times, or a single page of memory cells of that block of memory cells might be read 25,600,000. Each of these possibilities might produce the same level of read disturb on any memory cell of that block of memory cells.

When the number of reads for a block of memory cells exceeds the specification or other threshold (e.g., some threshold value less than the specification), valid data in that block of memory cells might be copied to a free block of memory cells, and then the initial block of memory cells might be erased and returned to the pool of free blocks of memory cells. This type of housekeeping operation on an array of memory cells might be performed in response to a stored value representative of the number of reads performed on the block of memory cells. This value may be stored in a register (e.g., the count register 128 of FIG. 1), or it may be stored in a reserved portion of the block of memory cells or in some other predetermined block of memory cells. This value is typically updated each time a read operation is performed on the block of memory cells.

Where only a portion of a block of memory cells is erased, e.g., an upper deck of memory cells or a lower deck of memory cells, a read count maintained for the entire block of memory cells might lead to a premature indication that read count leveling is warranted. For example, the block of memory cells might be approaching a threshold value of its read count when one portion of the block of memory cells, e.g., a lower deck of memory cells, is erased. As the erase operation moots the read disturb with regard to the erased memory cells, it would be premature to perform read count leveling on the entire block of memory cells in response to the read count reaching the threshold value. In particular, while the upper deck of memory cells in this example may warrant read count leveling due to read disturb, the lower deck of memory cells would not have experienced the same level of disturb due to its recent erasure, e.g., it was not subjected to the same number of read as the upper deck of memory cells. To address this issue, various embodiments institute respective read counts for each portion (e.g., deck) of memory cells of the block of memory cells. Table 1 demonstrates the action on the read count for each portion of the block of memory cells.

TABLE 1

| Operation | Register of First Portion | Register of Second Portion |
|---|---|---|
| Erase First Portion | Reset (e.g., set to 0) | No Action |
| Erase Second Portion | No Action | Reset (set to 0) |
| Read First Portion | Increment (e.g., +1) | Increment (e.g., +1) |
| Read Second Portion | Increment (e.g., +1) | Increment (e.g., +1) |

As can be seen from Table 1, when a read operation is performed for any memory cell (e.g., any logical page of memory cells) of a block of memory cells where different portions (e.g., decks) may be individually erased, the respective read count may be incremented, e.g., increased by one, for both the count register corresponding to one portion (e.g., deck) of memory cells of that block of memory cells and the count register corresponding to another portion (e.g., deck) of memory cells of that block of memory cells. However, when one portion is erased, only its count register might be reset, e.g., to zero, while no action might be taken with respect to the other count register, e.g., it might maintain its existing read count value.

When the value of a read count reaches a read count threshold (e.g., a value corresponding to a page level read capability or some lesser value) for either portion of memory cells of the block of memory cells, that portion of memory cells might be copied to a block of memory cells having a free portion of memory cells, which could include the same block of memory cells if the other portion is free (e.g., erased) or some other block of memory cells. The portion of memory cells of the block of memory cells reaching the read count threshold might then be erased while taking no action on the other portion of memory cells of the block of memory cells, e.g., if the value of its read count is below the read count threshold. The erased portion of memory cells could then be marked as free, e.g., setting a flag within the block to a value indicating that the block is available for storage of new data, and its read count could be reset, e.g., to 0.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. A memory, comprising:
an array of memory cells comprising a plurality of blocks of memory cells; and
a controller for access of the array of memory cells, wherein the controller is configured to cause the memory to:
increment a first read count in response to performing a read operation on a memory cell of a first portion of memory cells of a block of memory cells of the plurality of blocks of memory cells regardless of a location of the memory cell of the first portion of memory cells of the block of memory cell within the first portion of memory cells of the block of memory cells, the first read count corresponding to the first portion of memory cells of the block of memory cells;
increment a second read count in response to performing the read operation on the memory cell of the first portion of memory cells of the block of memory cells, the second read count corresponding to a second portion of memory cells of the block of memory cells;
increment the first read count in response to performing a read operation on a memory cell of the second portion of memory cells of the block of memory cells regardless of a location of the memory cell of the second portion of memory cells of the block of memory cells within the second portion of memory cells of the block of memory cells;

increment the second read count in response to performing the read operation on the memory cell of the second portion of memory cells of the block of memory cells;
reset the first read count in response to performing an erase operation on the first portion of memory cells of the block of memory cells; and
reset the second read count in response to performing an erase operation on the second portion of memory cells of the block of memory cells.

2. The memory of claim 1, wherein the controller is further configured to cause the memory to:
in response to a value of the first read count reaching a threshold:
copy data of the first portion of memory cells to a free portion of memory cells; and
after copying the data of the first portion of memory cells, erase the first portion of memory cells; and
in response to a value of the second read count reaching the threshold:
copy data of the second portion of memory cells to a free portion of memory cells; and
after copying the data of the second portion of memory cells, erase the second portion of memory cells.

3. The memory of claim 2, wherein the controller being configured to cause the memory to copy the data of the first portion of memory cells to the free portion of memory cells comprises the controller being configured to cause the memory to copy the data of the first portion of memory cells to a free portion of memory cells of a different block of memory cells of the plurality of blocks of memory cells.

4. The memory of claim 2, wherein the controller being configured to cause the memory to copy the data of the first portion of memory cells to the free portion of memory cells comprises the controller being configured to cause the memory to copy the data of the first portion of memory cells to a free portion of memory cells of the second portion of memory cells.

5. The memory of claim 2, wherein the controller being configured to cause the memory to copy the data of the second portion of memory cells to the free portion of memory cells comprises the controller being configured to cause the memory to copy the data of the second portion of memory cells to a free portion of memory cells of a different block of memory cells of the plurality of blocks of memory cells.

6. The memory of claim 2, wherein the controller being configured to cause the memory to copy the data of the second portion of memory cells to the free portion of memory cells comprises the controller being configured to cause the memory to copy the data of the second portion of memory cells to a free portion of memory cells of the first portion of memory cells.

7. The memory of claim 2, wherein the controller is further configured to cause the memory to set a value of the threshold in response to a page level read capability for the block of memory cells.

8. The memory of claim 7, wherein the controller being configured to cause the memory to set the value of the threshold comprises the controller being configured to cause the memory to set the value of the threshold to be less than a number corresponding to the page level read capability.

9. The memory of claim 1, wherein the block of memory cells comprises a plurality of strings of series-connected memory cells, wherein the first portion of memory cells of the block of memory cells comprises a respective portion of each string of series-connected memory cells of the plurality of strings of series-connected memory cells that is closer to any data line selectively connected to the block of memory cells than any memory cell of the second portion of memory cells, and wherein the second portion of memory cells of the block of memory cells comprises a respective portion of each string of series-connected memory cells of the plurality of strings of series-connected memory cells that is closer to a source selectively connected to the block of memory cells than any memory cell of the first portion of memory cells.

10. The memory of claim 1, wherein the controller being configured to cause the memory to reset the first read count in response to performing the erase operation on the first portion of memory cells of the block of memory cells further comprises the controller being configured to cause the memory to maintain a value of the second read count in response to performing the erase operation on the first portion of memory cells of the block of memory cells.

11. The memory of claim 10, wherein the controller being configured to cause the memory to reset the second read count in response to performing the erase operation on the second portion of memory cells of the block of memory cells further comprises the controller being configured to cause the memory to maintain a value of the first read count in response to performing the erase operation on the second portion of memory cells of the block of memory cells.

12. A memory, comprising:
an array of memory cells comprising a plurality of blocks of memory cells; and
a controller for access of the array of memory cells, wherein the controller is configured to cause the memory to:
increment a first read count in response to performing a read operation on a memory cell of a block of memory cells of the plurality of blocks of memory cells, the first read count corresponding to a first portion of memory cells of the block of memory cells;
increment a second read count in response to performing the read operation on the memory cell of the block of memory cells, the second read count corresponding to a second portion of memory cells of the block of memory cells;
reset the first read count in response to performing an erase operation on the first portion of memory cells of the block of memory cells;
reset the second read count in response to performing an erase operation on the second portion of memory cells of the block of memory cells; and
increment the first read count and the second read count in response to performing a read operation on any other memory cell of the block of memory cells.

13. A memory, comprising:
an array of memory cells comprising a plurality of blocks of memory cells; and
a controller for access of the array of memory cells, wherein the controller is configured to cause the memory to:
for each memory cell of a first portion of memory cells of a block of memory cells of the plurality of blocks of memory cells, and for each memory cell of a second portion of memory cells of the block of memory cells mutually exclusive of the first portion of memory cells:
increment a first read count in response to performing a read operation on that memory cell of the block of memory cells, the first read count corresponding to the first portion of memory cells;

increment a second read count in response to performing the read operation on that memory cell of the block of memory cells, the second read count corresponding to the second portion of memory cells;

reset the first read count in response to performing an erase operation on the first portion of memory cells without performing an erase operation on the second portion of memory cells;

reset the second read count in response to performing an erase operation on the second portion of memory cells without performing an erase operation on the first portion of memory cells; and reset the first read count and the second read count in response to performing a single erase operation on the first portion of memory cells and on the second portion of memory cells.

14. The memory of claim 13, wherein the block of memory cells is a first block of memory cells, and wherein the controller is further configured to cause the memory to:

in response to a value of the first read count reaching a threshold:

copy data of the first portion of memory cells to a free portion of memory cells selected from a group consisting of a free portion of memory cells of the second portion of memory cells, and a free portion of memory cells of a second block of memory cells of the plurality of blocks of memory cells different than the first block of memory cells; and after copying the data of the first portion of memory cells, perform an erase operation on the first portion of memory cells; and in response to a value of the second read count reaching the threshold:

copy data of the second portion of memory cells to a free portion of memory cells selected from a group consisting of a free portion of memory cells of the first portion of memory cells, and a free portion of memory cells of a third block of memory cells of the plurality of blocks of memory cells different than the first block of memory cells; and after copying the data of the second portion of memory cells, perform an erase operation on the second portion of memory cells.

15. The memory of claim 14, wherein the controller being configured to cause the memory to copy the data of the second portion of memory cells to the free portion of memory cells of the third block of memory cells different than the first block of memory cells further comprises the controller being configured to cause the memory to copy the data of the second portion of memory cells to the free portion of memory cells of the third block of memory cells different than the first block of memory cells and different than the second block of memory cells.

16. The memory of claim 12, wherein the controller being configured to cause the memory to reset the first read count in response to performing the erase operation on the first portion of memory cells of the block of memory cells further comprises the controller being configured to cause the memory to maintain a value of the second read count in response to performing the erase operation on the first portion of memory cells of the block of memory cells.

17. The memory of claim 16, wherein the controller being configured to cause the memory to reset the second read count in response to performing the erase operation on the second portion of memory cells of the block of memory cells further comprises the controller being configured to cause the memory to maintain a value of the first read count in response to performing the erase operation on the second portion of memory cells of the block of memory cells.

18. The memory of claim 12, wherein the controller being configured to cause the memory to reset the first read count in response to performing the erase operation on the first portion of memory cells of the block of memory cells and to reset the second read count in response to performing the erase operation on the second portion of memory cells of the block of memory cells further comprises the controller being configured to cause the memory to reset the first read count in response to performing an erase operation on the first portion of memory cells of the block of memory cells without performing an erase operation on the second portion of memory cells of the block of memory cells, to reset the second read count in response to performing an erase operation on the second portion of memory cells of the block of memory cells without performing an erase operation on the first portion of memory cells of the block of memory cells, and to reset the first read count and the second read count in response to performing an erase operation on the block of memory cells including the first portion of memory cells of the block of memory cells and the second portion of memory cells of the block of memory cells.

19. The memory of claim 12, wherein the block of memory cells comprises a plurality of strings of series-connected memory cells, wherein the first portion of memory cells of the block of memory cells comprises a respective portion of each string of series-connected memory cells of the plurality of strings of series-connected memory cells that is closer to any data line selectively connected to the block of memory cells than any memory cell of the second portion of memory cells, and wherein the second portion of memory cells of the block of memory cells comprises a respective portion of each string of series-connected memory cells of the plurality of strings of series-connected memory cells that is closer to a source selectively connected to the block of memory cells than any memory cell of the first portion of memory cells.

20. The memory of claim 13, wherein the block of memory cells comprises a plurality of strings of series-connected memory cells, wherein the first portion of memory cells of the block of memory cells comprises a respective portion of each string of series-connected memory cells of the plurality of strings of series-connected memory cells that is closer to any data line selectively connected to the block of memory cells than any memory cell of the second portion of memory cells, and wherein the second portion of memory cells of the block of memory cells comprises a respective portion of each string of series-connected memory cells of the plurality of strings of series-connected memory cells that is closer to a source selectively connected to the block of memory cells than any memory cell of the first portion of memory cells.

21. The memory of claim 14, wherein the controller being configured to cause the memory to copy the data of the second portion of memory cells to the free portion of memory cells of the third block of memory cells different than the first block of memory cells further comprises the controller being configured to cause the memory to copy the data of the second portion of memory cells to different free portion of memory cells of the second block of memory cells.

* * * * *